[19] United States Patent
Kawana et al.

[11] Patent Number: 5,972,564
[45] Date of Patent: Oct. 26, 1999

[54] ALKALI DEVELOPMENT TYPE PHOTOCURABLE CONDUCTIVE PASTE COMPOSITION AND PLASMA DISPLAY PANELS HAVING ELECTRODES FORMED THEREOF

[75] Inventors: Osamu Kawana, Tsurugashima; Katsuto Murata, Sakado, both of Japan

[73] Assignee: Taiyo Ink Manufacturing Co., Ltd., Japan

[21] Appl. No.: 09/038,167

[22] Filed: Mar. 11, 1998

[30] Foreign Application Priority Data

Mar. 26, 1997 [JP] Japan .................................... 9-089945

[51] Int. Cl.⁶ ...................................................... B03C 5/00
[52] U.S. Cl. ..................... 430/281.1; 430/280.1; 430/913; 313/582
[58] Field of Search ............................. 430/281.1, 280.1, 430/913; 313/582

[56] References Cited

U.S. PATENT DOCUMENTS 5,851,732  12/1998  Kanda et al. ........................... 430/321
5,858,616  1/1999  Tanaka et al. ......................... 430/281.1

*Primary Examiner*—Janet Baxter
*Assistant Examiner*—Rosemary Ashton
*Attorney, Agent, or Firm*—Rader, Fishman & Grauer; Ronald P. Kananen

[57] ABSTRACT

Disclosed are an alkali development type photocurable conductive paste composition and a plasma display panel having electrodes thereof formed of the composition. The conductive paste composition comprises (A) a copolymer resin resulting from the addition of glycidyl (meth)acrylate to a copolymer of methyl methacrylate with (meth)acrylic acid, (B) a photopolymerization initiator, (C) a photopolymerizable monomer, (D) a powder of at least one conductive metal selected from the group consisting of Au, Ag, Ni, and Al, (E) glass frit, and (F) an acidic phosphorus compound. A fine electrode circuit can be formed on a substrate to be used in the plasma display panel by applying the composition on the substrate, exposing the applied layer to radiation according a prescribed pattern, developing the coating film of the composition with an aqueous alkali solution, and calcining the developed coating film.

12 Claims, 1 Drawing Sheet

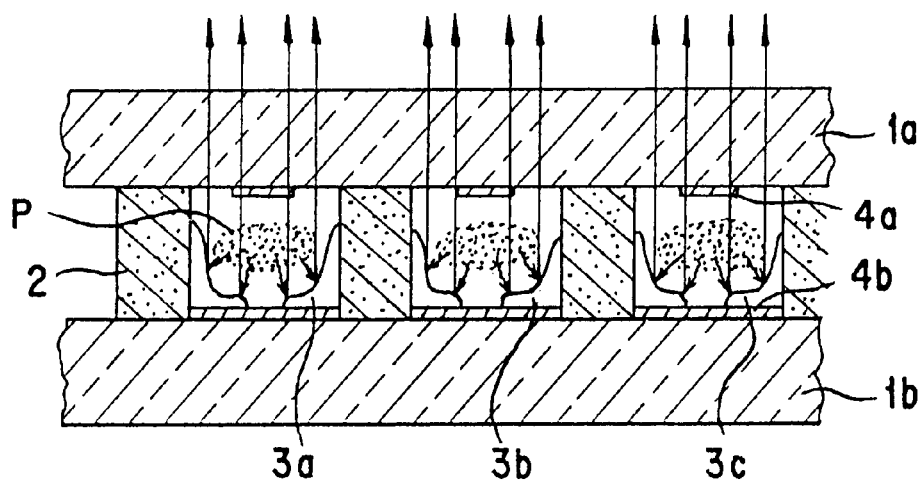
(PRIOR ART)

ALKALI DEVELOPMENT TYPE PHOTOCURABLE CONDUCTIVE PASTE COMPOSITION AND PLASMA DISPLAY PANELS HAVING ELECTRODES FORMED THEREOF

BACKGROUND OF THE INVENTION

1. Field of the Invention

This invention relates to an alkali development type photocurable conductive paste composition for forming a fine electrode circuit on a substrate to be used in a plasma display panel (hereinafter referred to briefly as "PDP") and the PDP having electrodes thereof formed of the composition.

2. Description of the Prior Art

The PDP is a planar display for displaying images and information by virtue of the emission of light by gas discharge. By the construction of panel and the method of operation, it is known in two types, i.e. DC (direct current) type and AC (alternating current) type.

By way of example, the principle of the DC type color PDP will be briefly explained below with reference to the attached FIGURE. In the DC type color PDP, the space intervening between two transparent substrates 1a and 1b (generally glass plates) is divided into numerous minute cells by latticed barrier ribs 2 interposed between the transparent substrates. The individual cells have such a discharge gas as He or Xe sealed therein. The reference numerals 3a through 3c denote fluorescent membranes which, on being excited by the ultraviolet light generated by the discharge of the discharge gas, emits visible light of three primary colors. On the inner faces of the two substrates, electrodes 4a and 4b are disposed as opposed to each other across the relevant cells. Generally, the cathodes 4a are formed of a film of transparent electroconductive material such as NESA glass. When a high voltage is applied between these electrodes 4a and 4b, the discharge gas which is sealed in the cells induces plasma discharge P and, by virtue of the ultraviolet light radiated consequently, incites the fluorescent elements of red (3a), blue (3b), and green (3c) colors to emit lights and effect the display of an image. In the full-color display system, three fluorescent elements severally of the three primary colors of red, blue, and green mentioned above jointly form one picture element.

The cells in the DC type PDP are divided by the component barrier ribs of a lattice, whereas those in the AC type PDP are divided by the barrier ribs which are arranged parallel to each other on the faces of substrates. In either case, the cells are divided by barrier ribs. These barrier ribs are intended to confine the luminous discharge within a fixed area so as to preclude false discharge or cross talk between adjacent discharge cells and ensure ideal display.

Heretofore, in the formation of electrode circuits on the substrates of the PDP, the practice of patterning an electrode material by the use of the screen printing technique has been adopted popularly.

In fulfilling the requirements such as enlarging a screen and improving the fineness of an electrode circuit which are expected of the PDP, the conventional screen printing method necessitates skillfulness on the part of the operator, produces such blemishes as blurs or blots during the course of printing, encounters difficulty in ensuring accuracy of registration of images owing to elongation or contraction of the screen, and suffers the problem of low yield.

Incidentally, photosensitive conductive pastes intended for ceramics-core printed circuit boards in which the formation of conductive patterns is effected on ceramic substrates by the technique of photolithography are under development recently.

This technique, however, is unfit for the PDP because it inherently carries out a calcining step at a temperature exceeding 800° C. and, when calcined at a temperature not higher than 600° C., i.e. the calcining temperature which is used during the manufacture of PDP (the substrates for the PDP must be calcined at a temperature not higher than 600° C. because soda-lime glass is generally used for the substrate), inevitably produces an uncalcined residue and brings about such an effect as induces degradation of the conductivity of an electrode circuit to be formed.

SUMMARY OF THE INVENTION

The heretofore known photosensitive conductive paste is manufactured by combining a conductive powder with a carboxyl group-containing resin, a photopolymerizable monomer, and a photopolymerization initiator and aimed at forming a conductive circuit pattern through patterning of a coating film of the resultant composition on a substrate by means of exposure to light and development thereof. When this composition additionally incorporates therein a low-melting glass frit so as to be rendered applicable to the PDP, however, the produced composition has such drawbacks as exhibiting poor stability during storage and betraying inferior workability in coating because of gelation or degradation of flowability.

An object of the present invention, therefore, is to provide an alkali development type photocurable conductive paste composition for use in a plasma display panel, which composition precludes such problems as are mentioned above, allows for ease in formation of an electrode circuit of high fineness on a substrate of a large area in high yield by the technique of photolithography, and undergoes a calcining step safely at a temperature not exceeding 600° C. without inducing occurrence of an uncalcined residue which has an adverse effect on an image.

Another object of the present invention is to provide a plasma display panel having highly fine electrode circuits formed of the conductive paste composition mentioned above.

To accomplish the objects mentioned above, the present invention provides an alkali development type photocurable conductive paste composition characterized by comprising (A) a copolymer resin resulting from the addition of glycidyl (meth)acrylate to a copolymer of methyl methacrylate with (meth)acrylic acid, (B) a photopolymerization initiator, (C) a photopolymerizable monomer, (D) a powder of at least one conductive metal selected from the group consisting of Au, Ag, Ni, and Al, (E) glass frit, and (F) an acidic phosphorus compound.

The term "glycidyl (meth)acrylate" used herein means glycidyl acrylate, glycidyl methacrylate, or a mixture thereof and the term "(meth)acrylic acid" means acrylic acid, methacrylic acid, or a mixture thereof.

Further, the present invention provides a plasma display panel having electrode circuits formed of the product of calcining such a conductive paste composition as mentioned above.

BRIEF DESCRIPTION OF THE DRAWING

The single FIGURE attached hereto is a fragmentary cross sectional view schematically illustrating the construction of a conventional DC type color PDP.

DETAILED DESCRIPTION OF THE INVENTION

The present inventors, after continuing a diligent study with a view to accomplishing the objects mentioned above, have found that a composition obtained by providing as a carboxyl group-containing photosensitive resin (A) a copolymer resin resulting from the addition reaction of glycidyl (meth)acrylate with a copolymer of methyl methacrylate, (meth)acrylic acid and mixing the copolymer resin with (B) a photopolymerization initiator, (C) a photopolymerizable monomer, (D) a conductive metal powder, and utilizing (E) a glass frit that is capable of being calcined at a temperature not higher than 600° C. The present inventors have further found that such problems attendant on a composition of this class as poor stability during storage and inferior workability in coating due to gelation or degradation of flowability can be solved by incorporating (F) an acidic phosphorus compound in the composition.

The alkali development type photocurable conductive paste composition of the present invention, therefore, enjoys freedom from such problems attendant on the conventional photosensitive conductive paste composition as poor stability during storage and inferior workability in coating due to gelation or degradation of flowability, allows for ease in the manufacture of a plasma display panel including the formation of an electrode circuit of high fineness on a substrate of a large area by the technique of photolithography. The invention further proves to be fully usable even when a calcining step is performed at a temperature not higher than 600° C., and realizes generous improvement in yield.

The composition of the present invention comprises the following components:

(A) a copolymer resin having glycidyl (meth)acrylate added to the copolymer of methyl methacrylate with (meth)acrylic acid, (B) a photopolymerization initiator, (C) a photopolymerizable monomer, (D) a conductive metal powder selected from among Au, Ag, Ni, and Al, (E) glass frit, and (F) an acidic phosphorus compound.

Regarding the ratios of the components of this composition, the ratio of the photopolymerization initiator (B) is preferred to be in the range of 5 to 20 parts by weight based on 100 parts by weight of the copolymer resin (A), that of the conductive metal power (D) in the range of 50 to 2,000 parts by weight based on 100 parts by weight of the total of components (A), (B), and (C), that of the glass frit (E) in the range of 3 to 7 parts by weight based on 100 parts by weight of the conductive metal powder (D), and that of the acidic phosphorus compound (F) in the range of 0.1 to 5 parts by weight based on 100 parts by weight of the glass frit (E). Furthermore, the composition may contain (G) a diluting solvent in a suitable amount, depending on the method to be adopted for the application of the paste. It may further incorporate therein an acrylic or a silicone-based antifoaming-leveling agent.

The copolymer resin (A) to be advantageously used in the present invention has a weight-average molecular weight in the range of 5,000 to 50,000, preferably 6,000 to 30,000, an acid value in the range of 80 to 150 mg KOH/g, preferably 95 to 125 mg KOH/g, and a double bond equivalent weight in the range of 400 to 2,000, preferably 800 to 1,500.

If the molecular weight of the copolymer resin (A) is lower than 5,000, the shortage will have an adverse effect on the fast adhesiveness of the conductive film to the substrate during the course of development. Conversely, if it is higher than 50,000, the excess will be at a disadvantage in degrading the developing property and tending to induce defective development. If the acid value of the copolymer resin is lower than 80 mg KOH/g, the shortage will disadvantageously degrade the developing property and tend to induce defective development. Conversely, if it is higher than 150 mg KOH/g, the excess will disadvantageously degrade the fast adhesiveness of the conductive film or inducing solution of a photocured area (exposed area) during the course of development. If the double bond equivalent weight of the copolymer resin is smaller than 400, the shortage will be at a disadvantage in tending to form a residue during the course of calcination. If it is larger than 2,000, the excess will be at a disadvantage in narrowing the allowance of operation of the development and necessitating a higher dose of radiation during the course of the photocuring work.

Examples of the photopolymerization initiators (B) to be used in the present invention include, but are not limited to: benzoin and alkyl ethers thereof such as benzoin, benzoin methyl ether, benzoin ethyl ether, and benzoin isopropyl ether; acetophenones such as acetophenone, 2,2-dimethoxy-2-phenyl acetophenone, 2,2-diethoxy-2-phenyl acetophenone, 1,1-dichloroacetophenone, 2-methyl-1-[4-(methylthio)phenyl]-2-morpholinopropan-1-one, 2-benzyl-2-dimethylamino-1-(4-morpholinophenyl)-butan-1-one; anthraquinones such as 2-methylanthraquinone, 2-ethylanthraquinone, 2-t-butyl-anthraquinone, 1-chloroanthraquinone, and 2-amylanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyl dimethyl ketal; benzophenones such as benzophenone; and xanthones. These well known and widely used photopolymerization initiators may be used either singly or in the form of a combination of two or more members. Optionally such a photopolymerization initiator (B) may be used in combination with one or more well-known conventional photosensitizers such as tertiary amines like N,N-(dimethylamino)ethylbenzoate, N,N-(dimethylamino)isoamyl benzoate, penthyl-4-dimethylamino-benzoate, triethyl amine, and triethanol amine.

In the composition of the present invention, the photopolymerizable monomer (C) is used for the purpose of improving the photocuring and developing properties of the produced composition. Examples of the photopolymerizable monomers (C) include, but are not limited to: 2-hydroxyethyl acrylate, 2-hydroxypropyl acrylate, diethylene glycol diacrylate, triethylene glycol diacrylate, polyethylene glycol diacrylate, polyurethane diacrylate, trimethylol propane triacrylate, pentaerythritol triacrylate, pentaerythritol tetraacrylate, ethylene oxide-modified trimethylol propane triacrylate, propylene oxide-modified trimethylol propane triacrylate, dipentaerythritol pentaacrylate, dipentaerythritol hexaacrylate; methacrylates corresponding to the acrylates enumerated above; and mono-, di-, tri-, and higher polyesters of polybasic acids with hydroxyalkyl (meth)acrylates. These monomers may be used either singly or in the form of a combination of two or more members.

Though the conductive metal powder (D) selected arbitrarily from among Au, Ag, Ni, and Al and used in the present invention may be in the form of spheres, flakes, or resinification, it is preferred to be in the shape of spheres in consideration of the photocuring properties of the composition and the dispersibility of the metal powder in the composition. For the conductive metal powder to be used advantageously herein from the viewpoint of resolution, it has an average particle diameter of not more than 20 µm, preferably not more than 5 µm. In order for the conductive metal powder to be prevented from oxidation, improved in dispersibility in the composition, and allowed to acquire a stabilized developing property, particularly the oil-absorbent Ag, Ni, or Al powder is preferred to be treated with a fatty acid. As concrete examples of the fatty acid which is usable for this treatment, oleic acid, linolic acid, linolenic acid, and stearic acid may be cited.

The composition of the present invention, for the purpose of improving the fast adhesiveness of the calcined electrode to the substrate, can incorporate therein 3 to 7 parts by weight of glass frit (E) based on 100 parts by weight of the conductive metal powder (D). The glass frit (E) which is used favorably herein has a glass transition point in the range of 300° to 500° C. and preferably has a thermal expansion coefficient, $\alpha_{300}$, in the range of $70-90\times10^{-7}/°C$. From the viewpoint of resolution, the glass frit has an average particle diameter of not more than 20 µm, preferably not more than 5 µm.

The glass frit is invariably usable herein so long as it has a low softening point, specifically a softening point not higher than about 600° C.

One preferable example of the PbO-based glass frit which can be advantageously used is an amorphous frit which is composed of (in percent by weight of oxide basis) 48–82%, preferably 55–78%, of PbO, 0.5–22%, preferably 1.0–10%, of $B_2O_3$, 3–32%, preferably 19–27%, of $SiO_2$, 0–12%, preferably 0.5–3.5%, of $Al_2O_3$, 0–17%, preferably 0–10%, of BaO, 0–25%, preferably 0–10%, of ZnO, 0–2.5% of $TiO_2$, and 0–25% of $Bi_2O_3$ and adjusted to have a softening point in the range of 350–600° C., preferably 420–590° C.

In the above amorphous frit, PbO is a basic component of a low melting frit and the content thereof is preferred to be in the range of 48–82%. If the PbO content exceeds 82%, the excess will cause the frit to have an unduly low softening point. Conversely, if it is less than 48%, the shortage will cause the frit to have an unduly high softening point. In either of the deviations from the specified range, the composition will incur difficulty in being perfectly calcined at the prescribed temperature. $B_2O_3$ is an essential component for lowering the softening point of the frit. If the $B_2O_3$ content exceeds 22%, the excess will deprive the frit of the ability to resist alkalis. Conversely, if it is less than 0.5%, the shortage will cause the frit to have an unduly high softening point. $SiO_2$ is a component for enhancing the ability of the frit to resist alkalis. If the $SiO_2$ content exceeds 32%, the excess will cause the frit to acquire an unduly high softening point. Conversely, if it is less than 3%, the shortage will deprive the frit of the ability to resist alkalis. $Al_2O_3$ is a component for improving the ability of the frit to resist alkalis and adjusting the softening point thereof. If the $Al_2O_3$ content exceeds 12%, the excess will cause the frit to acquire an unduly high softening point. Conversely, if it is less than 0.5%, the shortage will tend to impair the ability of the frit to resist alkalis.

The other preferable components which can be arbitrarily incorporated in the low melting frit mentioned above include BaO, ZnO, and $TiO_2$. BaO is effective in curbing the occurrence of bubbles in the calcined product and enhancing the denseness thereof. If the BaO content exceeds 17%, however, the excess will disadvantageously increase the thermal expansion coefficient of the frit. ZnO and $TiO_2$ are effective in enhancing the ability of the frit to resist alkalis. If the ZnO content exceeds 25% or the $TiO_2$ content exceeds 2.5%, the excess will dispose the glass to succumb to crystallization and lose stability.

One example of the $Bi_2O_3$-based glass frit is an amorphous frit which is composed of (in percent by weight of oxide basis) 35–88% of $Bi_2O_3$, 5–30% of $B_2O_3$, 0–20% of $SiO_2$, 0–5% of $Al_2O_3$, 1–25% of BaO, 1–20% of ZnO, and 0–2.5% of $TiO_2$ and adjusted to have a softening point in the range of 420–590° C.

One example of the ZnO-based glass frit is an amorphous frit which is composed of (in percent by weight of oxide basis) 25–60% of ZnO, 2–15% of $K_2O$, 25–45% of $B_2O_3$, 1–7% of $SiO_2$, 0–10% of $Al_2O_3$, 0–20% of BaO, and 0–10% of MgO and adjusted to have a softening point in the range of 420–590° C.

Since the low melting frit which is used in the present invention can incorporate therein any of the other components which are generally used as additives for the low melting frit, it can be freely designed on the condition that the temperature properties and the thermal expansion coefficient fall within the ranges mentioned above.

The composition of the present invention has for one of the salient characteristics thereof the incorporation therein of 0.1 to 5 parts by weight of an acidic phosphorus compound (F) based on 100 parts by weight of the glass frit (E) with a view to improving the stability thereof during storage. Examples of the phosphorus compound (F) include, but are not limited to: inorganic phosphoric acids such as phosphoric acid and phosphorous acid and organic phosphoric acids such as mono(2-methacryloyloxyethyl) acid phosphate, mono(2-acryloyloxyethyl) acid phosphate, di(2-methacryloyloxyethyl) acid phosphate, and di(2-acryloyloxyethyl) acid phosphate.

In accordance with the present invention, the composition is transformed by dilution into a pasty constitution capable of easy application to a substrate and the applied layer of the paste is dried to form a film capable of contact exposure. The composition, therefore, can incorporate therein a suitable amount of a diluting solvent (G). Examples of the solvents include, but are not limited to: ketones such as methyl ethyl ketone and cyclohexanone; aromatic hydrocarbons such as toluene, xylene, and tetramethyl benzene; glycol ethers such as cellosolve, methyl cellosolve, carbitol, methyl carbitol, butyl carbitol, propylene glycol monomethyl ether, dipropylene glycol monomethyl ether, dipropylene glycol monoethyl ether, and triethylene glycol monoethyl ether; acetates such as ethyl acetate, butyl acetate, cellosolve acetate, butyl cellosolve acetate, carbitol acetate, butyl carbitol acetate, and propylene glycol monomethylether acetate; alcohols such as ethanol, propanol, ethylene glycol, and propylene glycol; aliphatic hydrocarbons such as octane and decane; and petroleum solvents such as petroleum ether, petroleum naphtha, hydrogenated petroleum naphtha, and solvent naphtha. These solvents may be used either singly or in the form of a combination of two or more members.

The conductive pasty composition of the present invention is applied to a glass substrate of a plasma display panel by a suitable coating method such as, for example, the technique of screen printing or the use of a bar coater or a blade coater. Then, the applied layer of the pasty composition is treated in a hot air circulation type drying oven, for example, to expel the diluting solvent by distillation and allow the residual layer to dry to the touch. Thereafter, the dried layer is subjected to selective exposure, development, and calcination to form an electrode circuit in a prescribed pattern.

The step of exposure can be accomplished by using a photo mask containing a prescribed exposure pattern which is in contact with the dried layer (contact exposure) or out of contact with that layer (noncontact exposure). In terms of resolution, the contact exposure is preferred to the noncontact exposure. The exposure is preferred to be performed in the atmosphere of vacuum or nitrogen gas. The light sources which are usable for the exposure include a halogen lamp, a high-pressure mercury-vapor lamp, a laser beam, a metal halide lamp, a black lamp, and an electrodeless discharge lamp, for example.

For the step of development, the spray method or the immersion method is used. As a developing solution, the aqueous solutions of such alkali metals as sodium hydroxide, potassium hydroxide, sodium carbonate, potassium carbonate, and sodium silicate and the aqueous solutions of amines such as monoethanol amine, diethanol amine, and triethanol amine can be used advantageously. The developing solution is only required to saponify the copolymer resin in the composition and permit removal of the uncured areas (unexposed areas) and, therefore, is not required to be limited to those examples cited above. After the step of development, the developed layer is preferred to be washed with water or neutralized with an acid for the removal of the unwanted residual developer.

At the step of calcination, the substrate resulting from the step of development is heat-treated in the air or in the atmosphere of nitrogen gas at a temperature in the range of 450° to 600° C. to form a conductor pattern. This step is preferred to be effected subsequently to a step of removing an organic substance by heating at a temperature in the range of 400° to 500° C.

Now, the present invention will be described specifically below with reference to the working examples and comparative examples cited hereinafter. The terms "parts" and "%" which are mentioned therein are invariably based on weight unless otherwise specified.

Synthesis Example 1

Into a flask equipped with a thermometer, a stirrer, a dropping funnel, and a reflux condenser, methyl methacrylate and methacrylic acid were charged in a molar ratio indicated in Table 1 and dipropylene glycol monomethyl ether as a solvent and azobisisobutyronitrile as a catalyst were added thereto and they were together stirred under an atmosphere of nitrogen gas at 80° C. for 2–6 hours to obtain a resin solution.

The resultant resin solution was cooled and, in the presence of methyl hydroquinone as a polymerization inhibitor and tetrabutyl phosphonium bromide as a catalyst, subjected to addition reaction of glycidyl methacrylate with the carboxyl groups of the resin at a molar ratio indicated in Table 1 under the conditions of 95–105° C. and 16 hours. The reaction product was cooled and then removed.

The details of the copolymer resins, A and B, prepared by the procedure described above are shown in Table 1.

In Table 1, MMA stands for methyl methacrylate, MA for methacrylic acid, GMA for glycidyl methacrylate, Mw for the weight-average molecular weight of the copolymer resin, and Av for the acid value of the copolymer resin. The weight-average molecular weight of the produced copolymer resin was determined by high-speed liquid chromatography using a pump (produced by Shimadzu Seisakusho Ltd. and marketed under product code of "LC-6AD") connected to three columns (produced by Showa Denko K.K. and marketed under trademark designations of "Shodex" KF-804, KF-803, and KF-802).

TABLE 1

| | Copolymer resin | | | | |
|---|---|---|---|---|---|
| Kind | Molar ratio MMA:MA | GMA addition molar ratio | Mw | Av | Double bond equivalent weight |
| Resin A | 0.40:0.60 | 0.36 | 15000 | 125 | 448 |
| Resin B | 0.70:0.30 | 0.105 | 10000 | 100 | 1000 |

Synthesis Example 2

Copolymer resins, C–F, for comparison were prepared by following the procedure of Synthesis Example 1 described above. The molar ratios of moieties and the details of the produced copolymer resins are shown in Table 2.

TABLE 2

| | Copolymer resin | | | | |
|---|---|---|---|---|---|
| Kind | Molar ratio MMA:MA | GMA addition molar ratio | Mw | Av | Double bond equivalent weight |
| Resin C | 0.4:0.6 | 0.36 | 80000 | 125 | 448 |
| Resin D | 0.8:0.2 | — | 15000 | 115 | — |
| Resin E | 0.1:0.9 | 0.603 | 10000 | 98 | 288 |
| Resin F | 0.6:0.4 | 0.3 | 10000 | 41 | 457 |

Each of the copolymer resins obtained in Synthesis Examples mentioned above was compounded with other components at the ratios indicated below, stirred by a stirrer, and kneaded with a three-roll mill to be transformed into a pasty constitution.

The glass frit used in this case was that obtained by grinding a glass composition containing 60% of PbO, 20% of $B_2O_3$, 15% of $SiO_2$, and 5% of $Al_2O_3$ and having a thermal expansion coefficient, $\alpha_{300}$, of $70 \times 10^{-7}$/°C., a glass transition point of 445° C., and an average particle diameter of 1.6 $\mu$m. As the conductive metal powder, silver powder consisting of spheres of an average particle diameter of 1 $\mu$m was used in two types, i.e. the silver powder A treated with a fatty acid surface treating agent and the silver powder B having undergone no surface treatment.

| Composition No. 1 | |
|---|---|
| Resin A | 100.0 parts |
| Pentaerythritol triacrylate | 50.0 parts |
| 2-Benzyl-2-dimethylamino-1-(4-morpholinophenyl)-butan-1-one | 15.0 parts |
| Dipropylene glycol monomethyl ether | 100.0 parts |
| Silver powder A | 660.0 parts |
| Glass frit | 33.0 parts |
| Phosphorous acid | 0.3 part |
| Composition No. 2 | |
| Resin B | 100.0 parts |
| Ethylene oxide-modified trimethylol propane triacrylate | 50.0 parts |
| 2-Methyl-1-[4-(methylthio)phenyl]-2-morpholino-propan-1-one | 10.0 parts |
| 2,4-Isopropyl thioxanthone | 1.0 part |
| Ethyl ester of 4-dimethylaminobenzoic acid | 1.0 part |
| Dipropylene glycol monomethyl ether | 100.0 parts |
| Silver powder A | 648.0 parts |
| Glass frit | 32.5 parts |
| Mono(2-methacryloyl oxyethyl) acid phosphate | 0.3 part |

Composition No. 3

| | |
|---|---|
| Resin C | 100.0 parts |
| Pentaerythritol triacrylate | 50.0 parts |
| 2-Benzyl-2-dimethylamino-1-(4-morpholinophenyl)-butan-1-one | 15.0 parts |
| Dipropylene glycol monomethyl ether | 100.0 parts |
| Silver powder A | 660.0 parts |
| Glass frit | 33.0 parts |
| Phosphorous acid | 0.3 part |

Composition No. 4

| | |
|---|---|
| Resin D | 100.0 parts |
| Pentaerythritol triacrylate | 50.0 parts |
| 2-Benzy-2-dimethylamino-1-(4-morpholinophenyl)-butan-1-one | 15.0 parts |
| Dipropylene glycol monomethyl ether | 100.0 parts |
| Silver powder A | 660.0 parts |
| Glass frit | 33.0 parts |
| Phosphorous acid | 0.3 part |

Composition No. 5

| | |
|---|---|
| Resin E | 100.0 parts |
| Pentaerythritol triacrylate | 50.0 parts |
| 2-Benzyl-2-dimethylamino-1-(4-morpholinophenyl)-butan-1-one | 15.0 parts |
| Dipropylene glycol monomethyl ether | 100.0 parts |
| Silver powder A | 660.0 parts |
| Glass frit | 33.0 parts |
| Phosphorous acid | 0.3 part |

Composition No. 6

| | |
|---|---|
| Resin F | 100.0 parts |
| Pentaerythritol triacrylate | 50.0 parts |
| 2-Benzyl-2-dimethylamino-1-(4-morpholinophenyl)-butan-1-one | 15.0 parts |
| Dipropylene glycol monomethyl ether | 100.0 parts |
| Silver powder A | 660.0 parts |
| Glass frit | 33.0 parts |
| Phosphorous acid | 0.3 part |

Composition No. 7

| | |
|---|---|
| Resin A | 100.0 parts |
| Pentaerythritol triacrylate | 50.0 parts |
| 2-Benzyl-2-dimethylamino-1-(4-morpholinophenyl) butan-1-one | 15.0 parts |
| Dipropylene glycol monomethyl ether | 100.0 parts |
| Silver powder A | 660.0 parts |

Composition No. 8

| | |
|---|---|
| Resin A | 100.0 parts |
| Pentaerythritol triacrylate | 50.0 parts |
| 2-Benzyl-2-dimethylamino-1-(4-morpholinophenyl)-butan-1-one | 15.0 parts |
| Dipropylene glycol monomethyl ether | 100.0 parts |
| Silver powder A | 660.0 parts |
| Glass frit | 33.0 parts |

Composition No. 9

| | |
|---|---|
| Resin A | 100.0 parts |
| Pentaerythritol triacrylate | 50.0 parts |
| 2-Benzyl-2-dimethylamino-1-(4-morpholinophenyl)-butan-1-one | 15.0 parts |
| Dipropylene glycol monomethyl ether | 100.0 parts |
| Silver powder B | 660.0 parts |
| Glass frit | 33.0 parts |
| Phosphorous acid | 0.3 part |

Each of the compositions mentioned above was applied on the whole surface of a glass substrate with the aid of a 300-mesh polyester screen. Then, the applied layer of the composition was dried in a hot air circulation type drying oven at 90° C. for 20 minutes to form a tack-free coating film. Then, the coating film was exposed to radiation from a metal halide lamp as the light source through a negative film adapted to satisfy a line/space ratio of 50/100 µm to a calculated dose of 500 mJ/cm² on the composition. Thereafter, the exposed coating film was developed with an aqueous 1 wt. % $Na_2CO_3$ solution of 30° C. and washed with water. Finally, the developed coating film was heated in the air and left standing at 450° C. for 30 minutes and further heated and calcined in the air at 575° C. for 30 minutes to obtain a sample substrate. The sample substrate thus obtained was tested for various properties. The results of the test are shown in Table 3. The paste composition No. 9 was in the coagulated state because the silver powder B which had undergone no surface treatment was not sufficiently wetted with the liquid components. Thus, the exposed area of the coating film was dissolved out in the developing solution during the course of development.

Similar results were obtained in the experiments using Au, Al, and Ni in the place of the silver powder mentioned above as the conductive metal powder.

TABLE 3

| Properties | Composition Nos. | | | | | | | | |
|---|---|---|---|---|---|---|---|---|---|
| | 1 | 2 | 3 | 4 | 5 | 6 | 7 | 8 | 9 |
| Stability during storage | Good | Good | Good | Good | Good | Good | Good | Poor | Good |
| Line retention | Good | Good | Good | Dissolved | Good | Good | Good | Good | Dissolved |
| Space development | Good | Good | Bad | Good | Partially incomplete | Bad | Good | Good | Good |
| Line form after calcination | Good | Good | Good | — | Partially broken line | Good | Partially broken line | Good | — |
| Conductivity | Good | Good | Good | — | Deteriorated | Good | Good | Good | — |

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

What is claimed is:

1. A photocurable conductive paste composition, comprising:

(A) a copolymer resin resulting from the addition of glycidyl (meth)acrylate to a copolymer of methyl methacrylate with (meth)acrylic acid, (B) a photopolymerization initiator, (C) a photopolymerizable monomer, (D) a powder of at least one conductive metal selected from the group consisting of Au, Ag, Ni, and Al, (E) glass frit, and (F) an acidic phosphorus compound.

2. The composition according to claim 1, wherein said glass frit (E) is possessed of a glass transition point in the range of 300° to 550° C. and is present in an amount of 3 to 7 parts by weight, based on 100 parts by weight of said conductive metal powder (D).

3. The composition according to claim 1, wherein said copolymer resin (A) has a weight-average molecular weight in the range of 5,000 to 50,000, an acid value in the range of 80 to 150 mg KOH/g, and a double bond equivalent weight in the range of 400 to 2,000.

4. The composition according to claim 1, wherein said acidic phosphorus compound (F) is present in an amount of 0.1 to 5 parts by weight, based on 100 parts by weight of said glass frit (E).

5. The composition according to claim 1, wherein said photopolymerization initiator (B) is present in an amount of 5 to 20 parts by weight, based on 100 parts by weight of said copolymer resin (A).

6. The composition according to claim 1, wherein said photopolymerizable monomer (C) is present in an amount of 20 to 100 parts by weight, based on 100 parts by weight of said copolymer resin (A).

7. The composition according to claim 1, wherein said conductive metal powder (D) is present in an amount of 50 to 2,000 parts by weight, based on 100 parts by weight of the total of said copolymer resin (A), said photopolymerization initiator (B) and said photopolymerizable monomer (C).

8. The composition according to claim 1, wherein said conductive metal powder selected from the group consisting of Ag, Ni, and Al is a fatty acid-treated metal powder.

9. The composition according to claim 1, wherein said acidic phosphorus compound (F) is selected from the group consisting of inorganic phosphoric acids and organic phosphoric acids.

10. The composition according to claim 1, which further comprises a photosensitizer.

11. The composition according to claim 1, which further comprises an organic solvent.

12. A plasma display panel having electrodes thereof formed with the photocurable conductive paste composition set forth in claim 1.

* * * * *